(12) United States Patent  
Watanabe et al.

(10) Patent No.: US 8,741,166 B2
(45) Date of Patent: Jun. 3, 2014

(54) PLASMA ETCHING METHOD (71) Applicant: Hitachi High-Technologies Corporation, Tokyo (JP)

(72) Inventors: Tomoyuki Watanabe, Kudamatsu (JP); Michikazu Morimoto, Kudamatsu (JP); Mamoru Yakushiji, Shunan (JP); Tetsuo Ono, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/664,940

(22) Filed: Oct. 31, 2012

(65) Prior Publication Data

US 2013/0157470 A1    Jun. 20, 2013

(30) Foreign Application Priority Data

Oct. 31, 2011  (JP) ................. 2011-238166
Oct. 17, 2012  (JP) ................. 2012-229411

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC ................. 216/72; 216/79; 438/724

(58) Field of Classification Search
USPC ................. 216/72, 79; 438/724
See application file for complete search history.

(56) References Cited

U.S. PATENT DOCUMENTS 4,793,897 A * 12/1988 Dunfield et al. .......... 438/724
2004/0175950 A1* 9/2004 Puppo et al. ............. 438/691
2007/0082483 A1* 4/2007 Bai ........................... 438/637

FOREIGN PATENT DOCUMENTS

JP         10-303187        11/1998

* cited by examiner

*Primary Examiner* — Roberts Culbert
(74) *Attorney, Agent, or Firm* — Antonelli, Terry, Stout & Kraus, LLP.

(57) ABSTRACT

A plasma etching method that can improve an etching selection ratio of a film to be etched to a film different from the film to be etched compared with the related art is provided. The present invention provides a plasma etching method for selectively etching a film to be etched against a film different from the film to be etched, in which plasma etching of the film to be etched is performed using a gas that can cause to generate a deposited film containing similar components as components of the different film.

6 Claims, 8 Drawing Sheets

PLASMA ETCHING METHOD

BACKGROUND OF THE INVENTION

The present invention relates to a plasma etching method for performing an etching with using plasma.

A silicon oxide film and a silicon nitride film have excellent characteristics for an insulating film. Therefore, the silicon oxide film and the silicon nitride film are used in many processes in manufacturing of a semiconductor device. In a manufacturing process for a semiconductor device, there are many processes for etching a silicon nitride film formed on a silicon oxide film. For example, there is a manufacturing process for a spacer structure arranged on both sides of a gate electrode in formation of a doping layer in a transistor. In the spacer structure, in general, a silicon nitride film is used. The silicon nitride film is formed on a silicon oxide film formed around the gate electrode. The spacer structure is manufactured by etching the silicon nitride film. The silicon oxide film is used as a stopper film in etching the silicon nitride film.

As a technique for increasing a selected etching ratio of such a silicon nitride film, which is formed on the silicon oxide film, to the silicon oxide film, for example, JP-A-10-303187 discloses a technique for etching a silicon nitride film using a fluorocarbon gas such as a $CHF_3$ gas or a $CH_2F_2$ gas as an etching gas.

In the technique disclosed in JP-A-10-303187, the silicon nitride film is etched on the basis of a radical reaction involving a fluorine radical (F*) as main etching species. A fluorocarbon deposited film is deposited on the silicon oxide film. This makes it possible to reduce etching speed and increase the selected etching ratio to the silicon oxide film.

SUMMARY OF THE INVENTION

According to the related art, it is possible to increase the selected etching ratio of the silicon nitride film in comparison with the silicon oxide film. However, etching based on an ion/assist reaction mechanism mainly involving $CF_3$ ions as main etching spices progresses for the silicon oxide film as well. Therefore, when high bias is applied to a wafer for the purpose of improvement of the etching speed for the silicon nitride film and shape control in the manufacturing process for the spacer structure, the etching progresses in the silicon oxide film as well and the selection ratio of the silicon nitride film to the silicon oxide film falls.

However, according to the microminiaturization of semiconductor devices in recent years, in the manufacturing process for the spacer structure, a reduction in thickness of the silicon oxide film used as the stopper film for etching of the silicon nitride film is also conspicuous. Therefore, there is a demand for further improvement of the selected ratio of the silicon nitride film in comparison with the silicon oxide film.

In view of such a problem, the present invention provides a plasma etching method that can obtain a selected ratio of a silicon nitride film in comparison with a silicon oxide film requested in etching of the silicon nitride film on the silicon oxide film in manufacturing of a highly microminiaturized semiconductor device.

According to the present invention, in a plasma etching method for selectively etching a film to be etched against a film different from the film to be etched, plasma etching of the film to be etched is performed using a gas that can cause to generate a deposited film containing similar components (or compositions) as components of the different film.

Further, according to the present invention, in a plasma etching method for selectively etching a film to be etched against a film different from the film to be etched, plasma etching of the film to be etched is performed using a gas that can cause to generate a deposited film containing Si—O bonding.

Therefore, according to the configuration of the invention, the selected etching ratio of the film to be etched in comparison with the film different from the film to be etched can be improved in comparison with the prior art.

Other objects, features, and advantages of the invention will become apparent from the following description of the embodiments of the invention taken in conjunction with the accompanying drawings.

DESCRIPTION OF THE EMBODIMENTS

Embodiments of the present invention are explained below with reference to FIGS. 1 to 10D.

Figure 1:
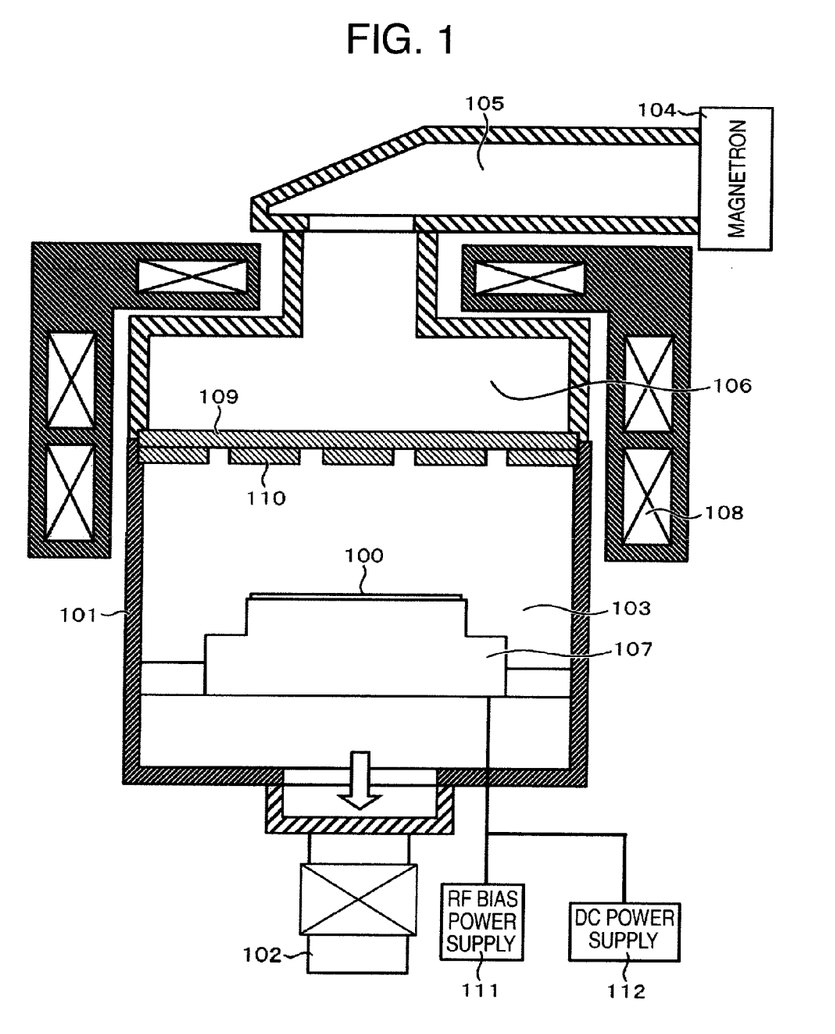
FIG. 1 is a diagram showing the configuration of a microwave plasma etching apparatus applied to the present invention.

FIG. 1 is a longitudinal sectional view of the configuration of a microwave plasma etching apparatus used in this embodiment. In FIG. 1, the plasma etching apparatus includes a vacuum container 101, means for supplying a microwave to the inside of the vacuum container 101, and exhausting means for exhausting the inside of the vacuum container 101.

The vacuum container 101 includes, on the inside thereof, a processing chamber 103 that is a space, on the inner side of which plasma is formed, and in which a specimen 100 serving as a treated target arranged on the inner side is treated by the plasma and a specimen table 107 that is arranged in the processing chamber 103 and on the upper surface of which the specimen 100 is placed and held. The vacuum container 101 has mounted thereon a magnetron power supply 104 that supplies a microwave, a waveguide 105 functioning as a conduit line that propagates the microwave and leads the microwave into the processing chamber 103, and a resonance container 106 that is connected to the waveguide 105. The microwave propagated through the inside of the waveguide 105 is led into the resonance container 106 and resonates in a space on the inside of the resonance container 106.

Further, a solenoid coil 108 that generates a magnetic field in the vacuum container 101 is arranged. The solenoid coil 108 is arranged to surround the outer circumference of an upper part of the vacuum container 101 having a cylindrical shape. The solenoid coil 108 generates the magnetic field with an electric current supplied thereto. In this embodiment, the solenoid coil 108 is arranged in plural stages. A magnetic field having a shape in which an iso-magnetic field is axially symmetric around the center axis in the up down direction and widens downward is led into the inner side of the processing chamber 103.

A vacuum pump 102 such as a turbo molecular pump functioning as exhaust means is arranged below the vacuum container 101. The vacuum pump 102 communicates with a circular opening for exhaust arranged in a lower part of the processing chamber 103 and right under the specimen table 107.

A resonance chamber 106', which is a space for resonance in the resonance container 106, having a cylindrical shape with the axis aligned with the axis of the resonance container 106 is arranged above the processing chamber 103 having the cylindrical shape. A disk-like window member 109 made of a dielectric, which forms the bottom surface of the resonance chamber 106', is arranged between the resonance chamber 106' and the processing chamber 103.

A disk-like shower plate 110 made of a dielectric is arranged spaced apart from and in parallel to the lower surface of the window member 109 under the window member 109. The lower surface of the shower plate 110 forms the ceiling surface of the processing chamber 103.

The shower plate 110 is arranged to be opposed to the upper surface of the specimen table 107. In the center of the shower plate 110, plural through-holes through which a gas for wafer treatment is led into the processing chamber 103 from above are arranged. A conduit through which an etching gas supplied from a gas source (not shown), which is set in a building such as a clean room in which the microwave plasma etching apparatus is set, flows communicates with the space between the window member 109 and the shower plate 110. After being led into the space through the conduit, the etching gas flows in the direction of the specimen table 107 below the conduit through the through-holes.

In the specimen table 107, an electrode made of a conductor is arranged. The electrode is electrically connected to a radio-frequency bias power supply 111 that supplies radio-frequency power having a predetermined frequency to the specimen table 107. In a state in which a wafer is placed on a placing surface on the upper surface of the specimen table 107, bias potential is formed on the surface of the wafer by the radio-frequency power supplied from the radio-frequency bias power supply 111. Ions are drawn into the upper surface of the wafer according to a potential difference between the bias potential and the potential of the plasma formed in the processing chamber 103 above the specimen table 107.

Further, a dielectric film (not shown) formed of a material of a dielectric such as $Al_2O_3$ or $Y_2O_3$ forming the placing surface for a specimen is arranged above the specimen table 107. An electrostatic attraction electrode that attracts the wafer onto the surface of the dielectric film with electrostatic force is arranged on the inside of the dielectric film. A DC power supply 112 that supplies DC power to the electrostatic attraction electrode is electrically connected thereto.

In the microwave plasma etching apparatus including the configuration explained above, in a state in which an inert gas such as argon is led into the processing chamber 103 from the gas source and the processing chamber 103 is exhausted by exhausting means to be decompressed, the wafer serving as the specimen 100 is conveyed onto the specimen table 107 through a gate valve (not shown) by conveying means (not shown) such as a robot arm and passed to the specimen table 107.

After being placed on the dielectric film forming the placing surface of the specimen table 107, the wafer serving as the specimen 100 is attracted onto the dielectric film and held thereon when electric power is supplied from the DC power supply 112 to the electrode in the dielectric film and electrostatic force is formed.

The etching gas is led into the processing chamber 103 from the gas source through the through-holes of the shower plate 110. The inside of the processing chamber 103 is adjusted to predetermined pressure through a balance between the lead-in of the etching gas and the exhaust by the vacuum pump 102. The microwave generated from the magnetron power supply 104 propagates through the waveguide 105 and reaches the resonance container 106. An electric field having predetermined intensity is formed in the resonance chamber 106' on the inside of the resonance container 106. The electric field is transmitted through the window member 109 and the shower plate 110 and supplied into the processing chamber 103.

According to an interaction between the magnetic field supplied from the solenoid coil 108 and the microwave supplied from the resonance container 106, the etching gas is excited and converted into plasma. Plasma is formed in the space above the specimen table 107 in the processing chamber 103. Etching is applied to the wafer using the formed plasma.

An example of the present invention in which the microwave plasma etching apparatus is used is explained below.

Embodiment 1

Under conditions of this example in which etching was performed using a mixed gas containing a $CH_3F$ gas, an $O_2$ gas, and an $SiF_4$ gas shown in Table 1 and conditions in the past, a silicon nitride film and a silicon oxide film were etched and etching selection ratios of the silicon nitride film to the silicon oxide film were compared and examined. A result of the comparison and examination is shown in FIG. 2.

TABLE 1

| | |
|---|---|
| $CH_3F$ gas | 50 sccm |
| $O_2$ gas | 20 sccm |
| $SiF_4$ gas | 5 sccm |
| Gas pressure | 0.5 Pa |
| Microwave power source power | 1400 W |
| Bias power source power | 40 W |

Figure 2:
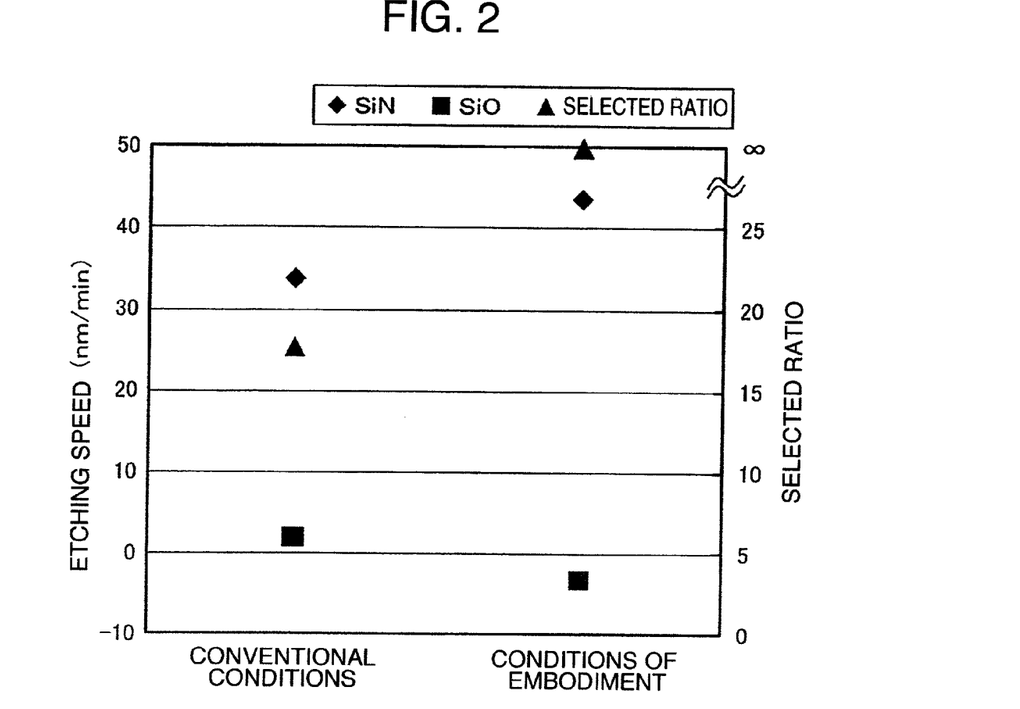
FIG. 2 is a graph showing a result obtained by comparing selected etching ratios of a silicon nitride film to a silicon oxide film under conditions of Embodiment 1 and under conditions in the past.

As shown in FIG. 2, under the conditions in the past, the selected etching ratio of the silicon nitride film to the silicon oxide film indicates a high value of about 17. However, since etching speed for the silicon oxide film is positive, etching of the silicon oxide film progresses.

On the other hand, under the conditions of this example, the etching speed for the silicon nitride film increases to be higher than that under the conditions in the past. The etching speed of the silicon oxide film is a negative value. This indicates that a deposit is formed on the silicon oxide film. Therefore, under the conditions of this example, the selected etching ratio of the silicon nitride film to the silicon oxide film is infinite.

As explained above, in this example, the selected etching ratio of the silicon nitride film to the silicon oxide film has been able to be substantially improved than that under the conditions in the past. In other words, it is possible to obtain a selection ratio of the silicon nitride film to the silicon oxide film required in etching of the silicon nitride film on the silicon oxide film for manufacturing of a highly microminiaturized semiconductor device.

The selected etching ratio of the silicon nitride film to the silicon oxide film means a value obtained by dividing the etching speed for the silicon nitride film by the etching speed for the silicon oxide film.

Figure 3:
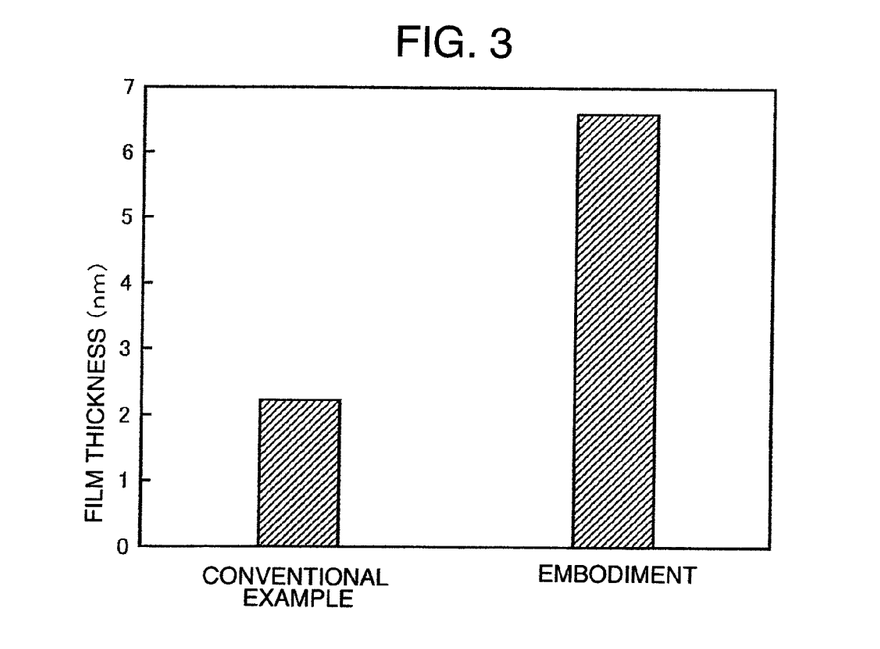
FIG. 3 is a graph showing an analysis result obtained using X-ray photoelectron spectroscopy.

To check a mechanism of the improvement of the selected etching ratio of the silicon nitride film to the silicon oxide film according to this example, the surface of a silicon wafer after treatment under the conditions of this example and the conditions in the past was analyzed using X-ray photoelectron spectroscopy (hereinafter referred to as XPS). An analysis result is shown in FIG. 3.

Under both the conditions of this example and the conditions in the past, a deposit was formed on the surface of the silicon wafer. When the deposit was analyzed by the XPS, as shown in FIG. 3, it was able to be confirmed that the thickness of the deposit was 6.6 nm under the conditions of this example, which was about three times as large as the thickness of the deposit of 2.2 nm under the conditions in the past. It was able to be confirmed that, under the conditions of this example, compared with the conditions in the past, more Si—O bonding was included in the deposit. According to this analysis result, it is considered that the selection ratio was improved because the deposit including the more Si—O bonding was deposited on the silicon oxide film.

Based on the analysis result of the XPS, a mechanism for the substantial improvement of the selected etching ratio of the silicon nitride film to the silicon oxide film by the deposit including the more Si—O bonding is considered as explained below.

FIGS. 4A to 4E are diagrams showing the progress of etching under the conditions of this example applied to a wafer in which a base film was the silicon oxide film, a mask was the silicon oxide film, and a film to be etched was the silicon nitride film.

Figure 4A:
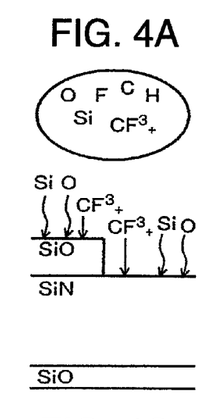
FIGS. 4A to 4E are diagrams showing etching progress in Embodiment 1.
Figure 4B:
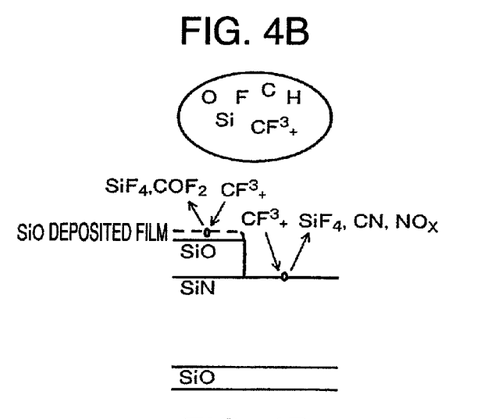

FIG. 4A shows the progress immediately after occurrence of plasma. The etching of the wafer is performed mainly by an ion/assist reaction with radicals and ions generated by the plasma. The $SiF_4$ gas and the $O_2$ gas are dissociated from each other by the plasma, whereby Si and O are generated in the plasma. As shown in FIG. 4B, the Si and O adhere to the surface of the mask of the silicon oxide film as a deposited film of Si—O bonding.

On the other hand, on the surface of the silicon nitride film, since the O combines with N of the silicon nitride film and changes to NOx having high volatility before Si—O bonding of the Si and O, the deposited film of the Si—O bonding is less easily generated on the surface of the silicon nitride film. This is because, since bonding energy (150 Kcal/mol) of N—O bonding is higher than bonding energy (105 Kcal/mol) of Si—N bonding, when the O adheres to the surface of the silicon nitride film, N of the silicon nitride film is easily extracted.

Figure 4C:
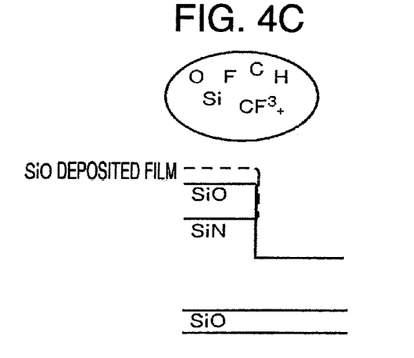

Therefore, as shown in FIG. 4C, the mask of the silicon oxide film is not etched and etching of only the silicon nitride film progresses.

Figure 4D:
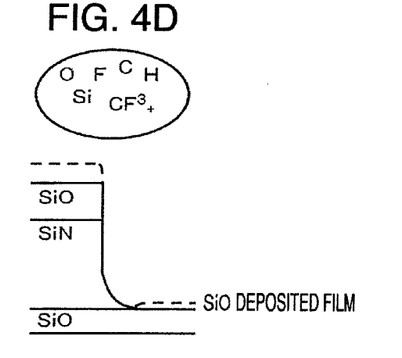

When the silicon nitride film is removed by the etching, the silicon oxide film serving as the base film is exposed. However, as shown in FIG. 4D, on the surface of the silicon oxide film serving as the base film, as on the surface of the mask of the silicon oxide film, the Si and O in the plasma adhere as the deposited film of the Si—O bonding.

At this point, since an etching shape of the silicon nitride film is a taper shape, additional etching for changing the etching shape to a vertical shape is necessary. However, since the deposited film of the Si—O bonding is generated on the surface of the silicon oxide film serving as the base film, the silicon oxide film serving as the base film is not etched.

Figure 4E:
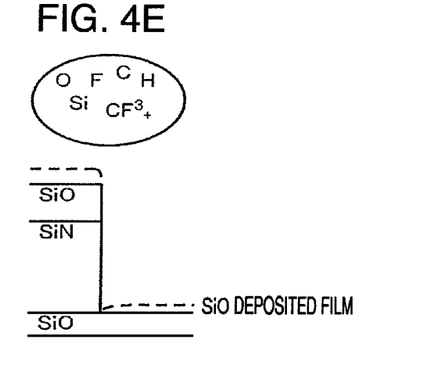

Therefore, as shown in FIG. 4E, the vertical shape can be obtained without damaging the silicon oxide film serving as the base film.

Subsequently, dependency of a flow rate of the $SiF_4$ gas to the mixed gas containing the $CH_3F$ gas and the $O_2$ gas at the selected etching ratio of the silicon nitride film to the silicon oxide film was checked. A result of the check of the dependency is shown in FIG. 5.

Figure 5:
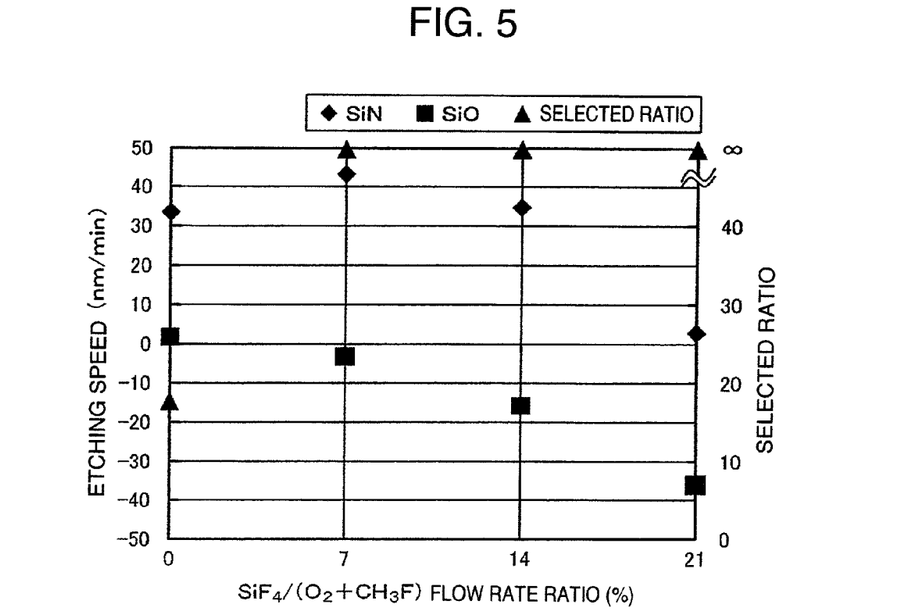
FIG. 5 is a graph showing dependency of an $SiF_4$ gas flow rate on a mixed gas containing a $CH_3F$ gas and an $O_2$ gas in an selected etching ratio of the silicon nitride film to the silicon oxide film.

As shown in FIG. 5, when the $SiF_4$ gas is added, the etching speed for the silicon nitride film increases and the etching speed for the silicon oxide film is changed to negative. The etching does not progress. The etching speed for the silicon nitride film is maximized near a point where a flow ratio of the $SiF_4$ gas to the mixed gas containing the $CH_3F$ gas and the $O_2$ gas is near 7%. When the flow ratio increases to be equal to or higher than 7%, the etching speed decreases.

When the flow ratio exceeds 20%, the etching speed for the silicon nitride film decreases to about 3.0 nm/min. When the flow ratio further increases, the silicon nitride film changes to an etch-stop state in which etching of the silicon nitride film does not progress. Therefore, the $SiF_4$ gas is desirably used at a flow ratio equal to or lower than 20% to the mixed gas containing the $CH_3F$ gas and the $O_2$ gas.

Subsequently, dependency of the flow rate of the $O_2$ gas on the mixed gas containing the $CH_3F$ gas and the $SiF_4$ gas at the selected etching ratio of the silicon nitride film to the silicon oxide film was checked. A result of the checking of the dependency is shown in FIG. 6.

Figure 6:
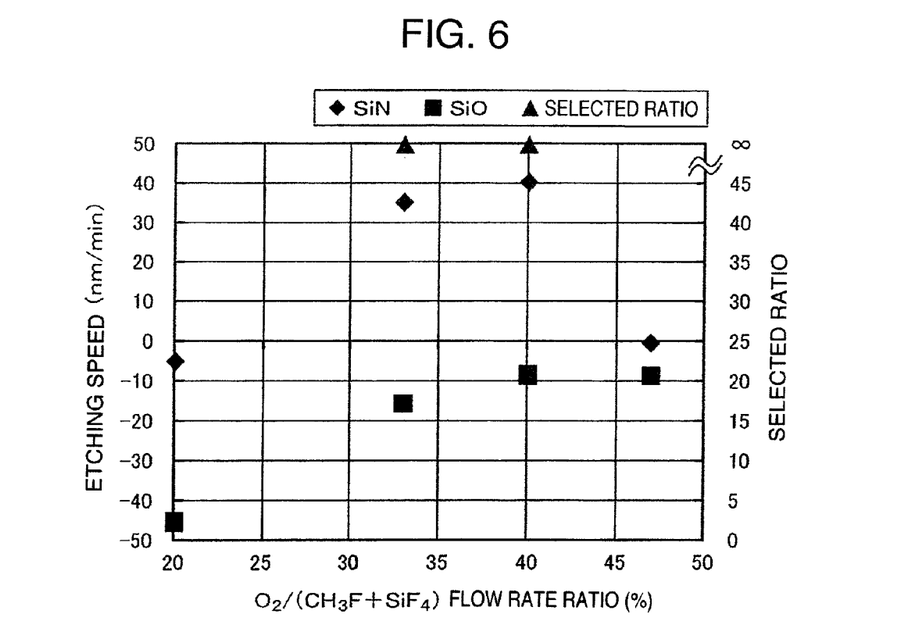
FIG. 6 is a graph showing dependency of an $O_2$ gas flow rate on a mixed gas containing a $CH_3F$ gas and an $SiF_4$ gas in the selected etching ratio of the silicon nitride film to the silicon oxide film.

As shown in FIG. 6, irrespective of the flow ratio of the $O_2$ gas to the mixed gas containing the $CH_3F$ gas and the $SiF_4$ gas, the etching speed for the silicon oxide film is a negative value. Therefore, it is seen that etching of the silicon oxide film does not progress.

On the other hand, the etching speed for the silicon nitride film substantially changes depending on the flow ratio of the $O_2$ gas. In a region where the flow ratio of the $O_2$ gas is equal to or lower than 25% and a region where the flow ratio of the $O_2$ gas is equal to or higher than 45%, etching of the silicon nitride film is stopped. Therefore, the silicon nitride film is desirably used in the region where the flow ratio of the $O_2$ gas is between 25% and 45%.

Since the etching speed for the silicon nitride film substantially changes according to the flow ratio of the $O_2$ gas, it is possible to control the etching speed for the silicon nitride film to desired etching speed by appropriately setting the flow ratio of the $O_2$ gas.

According to the microminiaturization of semiconductor devices in recent years, the silicon nitride film to be etched in this embodiment is also reduced in thickness. When such a thin film is etched, it is easy to control an etching amount by reducing the etching speed for the silicon nitride film. In this embodiment, as explained above, the etching speed for the silicon nitride film can be controlled to desired etching speed according to the flow ratio of the $O_2$ gas. Therefore, this embodiment is effective for the etching explained above as well.

In this embodiment, the mixed gas containing the $CH_3F$ gas, the $O_2$ gas, and the $SiF_4$ gas is used. However, an effect same as the effect in this embodiment can be obtained even if a fluorocarbon gas and an oxygen containing gas are respectively used as the $CH_3F$ gas and the $O_2$ gas. As the fluorocarbon gas, at least one gas among the $CH_3F$ gas, a $CH_2F_2$ gas, and a $CHF_3$ gas can be used.

As the oxygen containing gas, at least one gas among the $O_2$ gas, a CO gas, and a $CO_2$ gas can be used. Further, an inert gas may be added to a mixed gas containing the fluorocarbon gas, the oxygen containing gas, and the $SiF_4$ gas. As the inert gas, at least one gas among an He gas, an Ne gas, an Ar gas, an Xe gas, and a Kr gas can be used.

An effect same as the effect in this embodiment can be obtained even if a mixed gas containing a $CH_4$ gas and a fluorine containing gas is used as an alternative gas for the fluorocarbon gas. As the fluorine containing gas, at least one gas of an $SF_6$ gas and the $CF_4$ gas can be used.

In this embodiment, the film to be etched is the silicon nitride film. However, an effect same as the effect in this embodiment can be obtained even if a silicon nitride oxide film (SiON film) or a silicon nitride carbide oxide film (SiOCN film) is used as the film to be etched. An effect same as the effect in this embodiment can be obtained even if a silicon carbide film (SiC film) or a silicon carbide oxide film (SiOC film) is used as the film to be etched. In the case of the silicon carbide film (SiC film) and the silicon carbide oxide film (SiOC film), O generated by dissociation of the $O_2$ gas during etching and C in the film to be etched combine with each other and COx having high volatility is generated. Therefore, it is possible to improve a selected etching ratio of the film to be etched to the silicon oxide film.

In this embodiment, the application example in the microwave plasma etching apparatus of the ECR (Electron Cyclotron Resonance) system employing the microwave is explained. However, the present invention is not limited to this. The present invention may be applied to a plasma etching apparatus including plasma generating means of a capacitive coupling type or an inductive coupling type.

As explained above, the present invention is a plasma etching method for etching, using a gas that can generate a deposited film containing components same as components of a film different from a film to be etched, a film to be etched in which generation of a deposited film is suppressed. Therefore, according to the present invention, it is possible to substantially improve a selected etching ratio of the film to be etched, in which generation of the deposited film is suppressed, to the film different from the film to be etched than that in the related art.

As another embodiment of the present invention, in etching of a polysilicon film in which a metal electrode material is used as a base film, for example, when a TaN film or a WN film is used as the base film, a deposited film containing Ta or W is formed on the TaN film or the WN film by etching the polysilicon film using a $TaF_5$ gas or a $WF_6$ gas. Therefore, it is possible to substantially improve a selected etching ratio of the polysilicon film to the TaN film or the WN film than that in the related art.

Embodiment 2

With respect to forming silicon nitride film spacers or the like in recent manufacturing processes of semiconductor devices, the problem that a selection ratio of a silicon nitride film relative to a polysilicon film or a silicon substrate according to the related art is insufficient has become conspicuous. Therefore, in this embodiment, means for improving a selection ratio of a silicon nitride film in comparison with a polysilicon film or a silicon substrate is explained.

Figure 7:
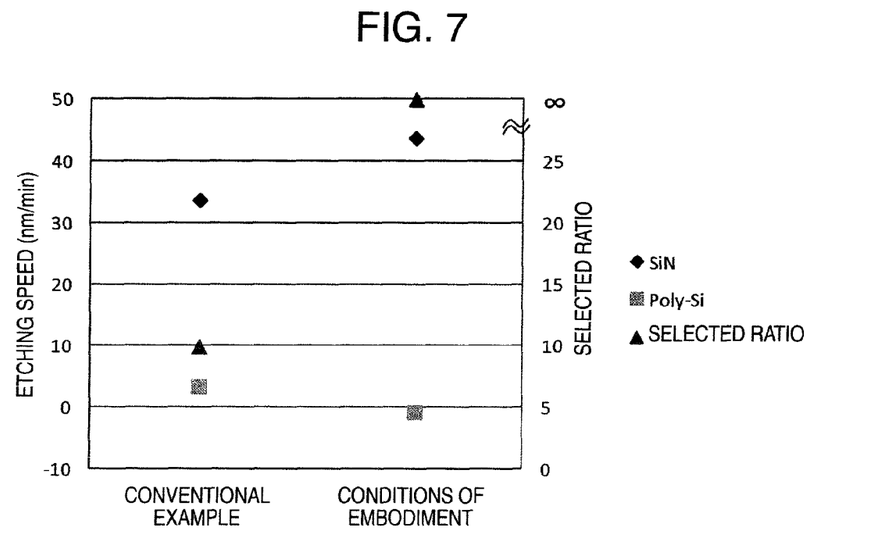
FIG. 7 is a graph showing a result obtained by comparing selected etching ratios of a silicon nitride film to a polysilicon film under conditions of Embodiment 2 and under conditions in the past.

First, a selected etching ratio (or an etching selection ratio) of a silicon nitride film to a silicon substrate was compared and examined. Under conditions of this embodiment in which etching was performed using a mixed gas containing a $CH_3F$ gas, an $O_2$ gas, and an $SiF_4$ gas as shown in Table 2 and conditions in the past, a polysilicon film (Poly-Si) that was deposited on a silicon substrate in place of a silicon substrate per se and a silicon nitride film were respectively etched and a selected etching ratio of the silicon nitride film to the polysilicon film was compared and examined. A result of the comparison and examination is shown in FIG. 7.

Incidentally, the reason for using a polysilicon film in place of a silicon substrate to determine the selected etching ratio of the silicon nitride film to a silicon substrate is that, although there is a difference such that a silicon substrate is monocrystalline whereas a polysilicon film is polycrystalline, the constituent element for both the silicon substrate and the polysilicon film is the silicon (Si) element.

TABLE 2

| | |
|---|---|
| $CH_3F$ gas | 50 sccm |
| $O_2$ gas | 20 sccm |
| $SiF_4$ gas | 5 sccm |
| Gas pressure | 0.5 Pa |
| Microwave power source power | 1400 W |
| Bias power source power | 40 W |

As shown in FIG. 7, under the conditions in the past, the selected etching ratio of the silicon nitride film to the polysilicon film is about 10. However, since the etching speed for the polysilicon film is positive, etching of the polysilicon film progresses.

On the other hand, under the conditions of this embodiment, the etching speed for the polysilicon film is a negative value. This indicates that a deposit is formed on the polysilicon film. Therefore, under the conditions of this embodiment, the selected etching ratio of the silicon nitride film to the polysilicon film is infinite.

As explained above, in this embodiment, the selected etching ratio of the silicon nitride film to the polysilicon film has been able to be substantially improved than that under the conditions in the past. In other words, it is possible to obtain a selection ratio of the silicon nitride film to a silicon substrate required in etching of the silicon nitride film on the silicon substrate for manufacturing of a highly microminiaturized semiconductor device.

The selected etching ratio of the silicon nitride film to the polysilicon film means a value obtained by dividing the etching speed for the silicon nitride film by the etching speed for the polysilicon film.

Since a gas system used in this embodiment is the same as the gas system used in Embodiment 1, based on the result of analysis using XPS shown in FIG. 3, it tends to generate a deposited film containing Si—O bonding under the conditions shown in Table 2 in comparison to the conditions in the past, and it is considered that depositing the deposited film on the polysilicon film contributed the improvement of the selection ratio.

Based on this result, a mechanism for the substantial improvement of the selection ratio of the silicon nitride film to the polysilicon film under the conditions shown in Table 2 is explained below using FIGS. 8A to 8E.

FIGS. 8A to 8E are diagrams showing the progress of etching under the conditions of this embodiment applied to a wafer in which a base was the silicon substrate, a mask was the silicon oxide film, and a film to be etched was the silicon nitride film.

Figure 8A:
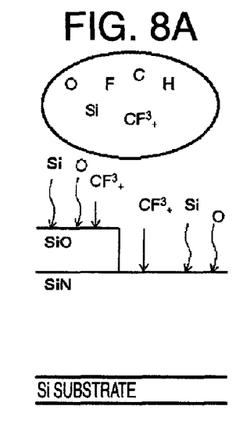
FIGS. 8A to 8E are diagrams showing etching progress in Embodiment 2.
Figure 8B:
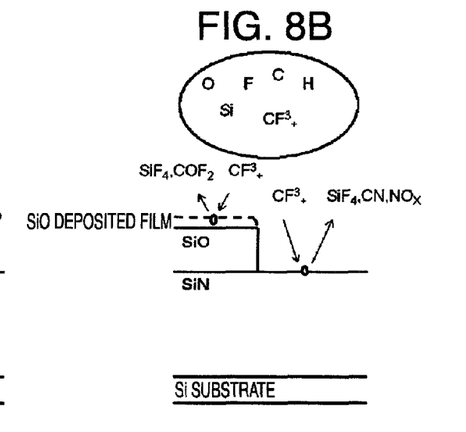

FIG. 8A shows the progress immediately after occurrence (or creation) of plasma. The etching of the wafer is performed mainly by an ion/assist reaction (or an ion-assisted reaction)

with radicals and ions generated by the plasma. The $SiF_4$ gas and the $O_2$ gas are respectively dissociated by the plasma, whereby Si and O are generated in the plasma. As shown in FIG. 8B, the Si and the O adhere to the surface of the mask of the silicon oxide film as a deposited film containing Si—O bonding.

On the other hand, on the surface of the silicon nitride film, since the O combines with N of the silicon nitride film and changes to NOx having high volatility before Si—O bonding of the Si and the O, the deposited film of the Si—O bonding is less easily generated on the surface of the silicon nitride film. This is because, since bonding energy (150 Kcal/mol) of N—O bonding is higher than bonding energy (105 Kcal/mol) of Si—N bonding, after Si—N bonds of the silicon nitride film are broken up by ions, the N tends to combine with the O that has adhered to the silicon nitride film.

Figure 8C:
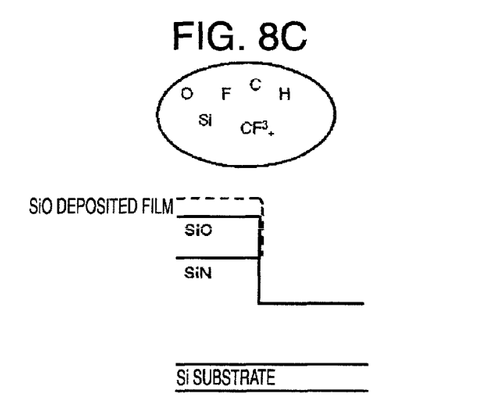

Therefore, as shown in FIG. 8C, the mask of the silicon oxide film on which a deposited film is generated is not etched, and etching of only the silicon nitride film on which a deposited film is difficult to be generated progresses.

When the silicon nitride film is removed by the etching, the silicon substrate serving as the base is exposed and it comes into a state that it is subjected to etching by the plasma. However, a deposit also adheres in a similar manner to the surface of the silicon substrate and the surface of the silicon substrate is oxidized by O contained in the deposit to form a silicon oxide film.

Figure 8D:
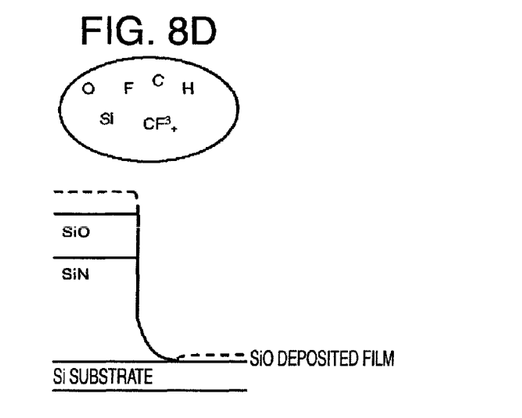

Therefore, as shown in FIG. 8D, a deposited film containing the Si—O bonding is generated on the surface of the silicon substrate, similar to the silicon oxide film of the mask. Because this deposited film is generated, etching of the silicon substrate does not progress and a high selection ratio in terms of the silicon nitride film of the film to be etched is obtained. The reason a silicon oxide film is formed on the surface of the silicon substrate is that, after Si—Si bonds (bonding energy: 76Kcal/mol) on the surface of the silicon substrate are broken by energy of ions, Si—O bonding (the bonding energy: 192 Kcal/mol) of a high bonding energy tends to be generated with O contained in the deposited film upon recombination of Si rather than generating Si—Si bonding or Si—F bonding (the bonding energy: 130 Kcal/mol).

At the moment of FIG. 8D, since an etching shape (or an etched profile) of the silicon nitride film is a taper shape, additional etching for changing the etching shape to a vertical shape is necessary. However, since the deposited film containing Si—O bonding is generated on the surface of the silicon substrate serving as the base, the silicon substrate serving as the base is not etched.

Figure 8E:
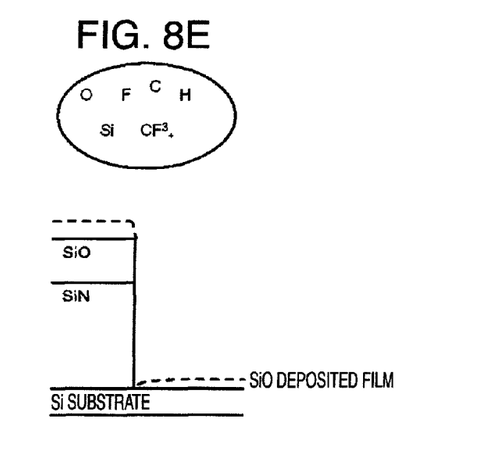

Therefore, as shown in FIG. 8E, the vertical shape can be obtained without damaging the silicon substrate serving as the base.

Although a silicon substrate is employed as the base of the silicon nitride film here, even when a polysilicon film is employed as the base, a high selection ratio is similarly obtained with the silicon nitride film, and etching can be performing without damaging.

Next, an example in which the present invention is applied to formation of spacers of a silicon nitride film for which a high selection ratio of a silicon nitride film to a silicon substrate and a high selection ratio of a silicon nitride film to a polysilicon film are required is explained.

Figure 9A:
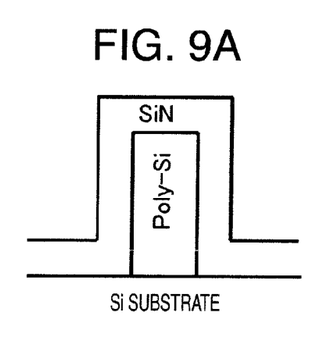
FIGS. 9A to 9D are diagrams showing etching progress in formation of spacers of a silicon nitride film in Embodiment 2.

To form spacers from a silicon nitride film that is formed so as to cover a gate electrode constituted by a polysilicon film (Poly-Si) as shown in FIG. 9A, the silicon nitride film at the upper part of the gate electrode and the silicon nitride film over the silicon substrate are etched, and the silicon nitride film on the sides of the gate electrode is left to form spacers of the silicon nitride film.

Since the silicon nitride film covering the sides of the gate electrode must be left without been etched, it is necessary to supply high radio-frequency power from the radio-frequency bias power supply 111 to draw in ions perpendicularly so that highly anisotropic etching is performed. However, since the ion energy increases with supplying high radio-frequency power, the polysilicon film and the silicon substrate are also liable to be etched.

Therefore, in highly anisotropic etching there has been the possibility of causing damage to the silicon substrate or the polysilicon film according to the method of the related art. That is, it can be said that a selection ratio of the silicon nitride film to the silicon substrate and a selection ratio of the silicon nitride film to the polysilicon film have been insufficient for forming the spacers of the silicon nitride film according to the method of the related art.

In addition, since there is a demand for greater anisotropy of etching even in spacer formation accompanying the micro-miniaturization of semiconductor devices, the radio-frequency bias powers that are used are increasing. Consequently, there is a possibility that a required selection ratio can not be obtained according to the method of the related art.

Figure 9B:
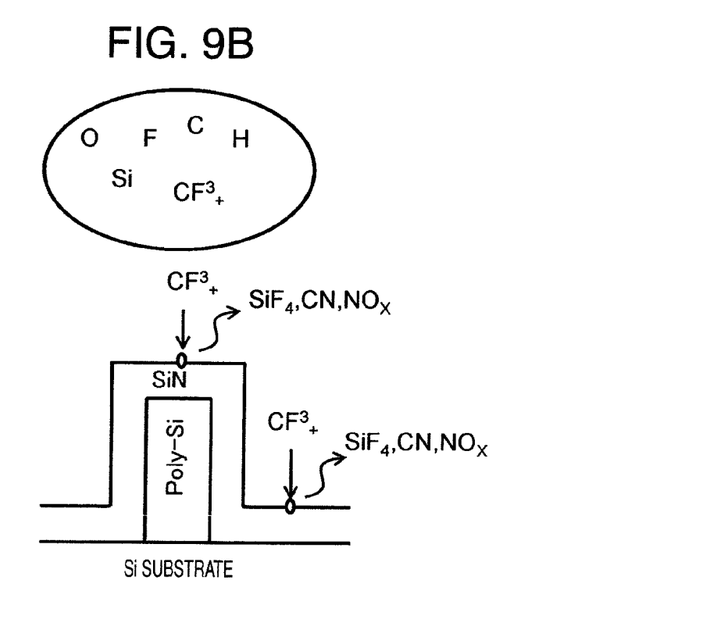
Figure 9C:
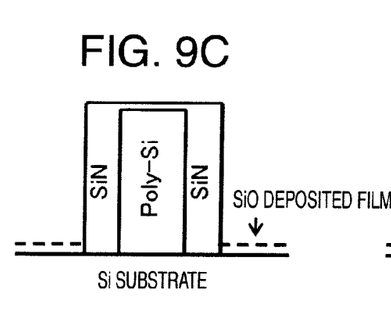
Figure 9D:
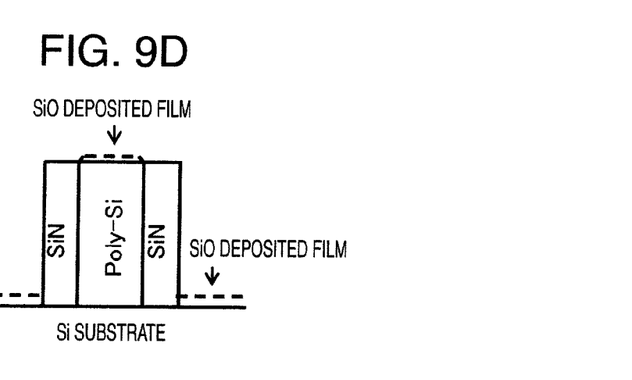

When the present embodiment is applied to formation of the spacers of the silicon nitride film as shown in FIG. 9D, a deposit is deposited selectively on the surfaces of the polysilicon film and the silicon substrate and, thus, etching of the polysilicon film and the silicon substrate does not progress, and a shape without damage can be obtained. Hereinafter, an example is explained in which this embodiment is applied to formation of the spacers of the silicon nitride film.

The same conditions as those shown in Table 2 are used as the etching conditions. A process gas is turned into plasma inside the processing chamber 103, and radicals and ions are generated. Further, an $SiF_4$ gas and an $O_2$ gas are dissociated respectively by the plasma, whereby generating Si and O in the plasma.

Etching is performed mainly by an ion/assist reaction (or an ion-assisted reaction) with the radicals and the ions generated. Here, since ions are drawn in by a radio-frequency bias power applied to the specimen table 107, the silicon nitride films over the silicon substrate and at the upper part of the gate electrode are etched as shown in FIG. 9B. Also, although the Si and the O are deposited as a deposited film containing Si—O bonding, as described in the present embodiment, since the O combines with N of the silicon nitride film and changes to NOx having high volatility before Si—O bonding on the silicon nitride film, the deposited film of the Si—O bonding is less easily generated on the surface of the silicon nitride film and, therefore, etching of the silicon nitride film progresses.

When etching of the silicon nitride film progresses, it comes to a state where the silicon substrate is exposed first and the silicon nitride film remains at the upper part of the gate electrode as shown in FIG. 9C. Since the bare silicon substrate is exposed to the plasma until etching of the silicon nitride film at the upper part of the gate electrode ends, there are cases where the silicon substrate is damaged according to the method of the related art. However, in the present embodiment etching of the silicon substrate would not progress since a deposited film containing Si—O bonding is deposited on the silicon substrate. Therefore, the silicon substrate is not etched even during a time period until etching of the silicon nitride film at the upper part of the gate electrode finishes.

Further, when performing additional etching after the upper part of the gate electrode is exposed, the polysilicon film is not etched since a deposited film containing Si—O bonding is deposited also on the upper part of the polysilicon film as shown in FIG. 9D. Thus, the spacers of the silicon nitride film can be formed without damaging the silicon substrate or the polysilicon film as shown in FIG. 9D.

Although in FIG. 9C the silicon nitride film on the silicon substrate disappears first and the silicon substrate is exposed, it is the same in a case where the silicon nitride film at the upper part of the gate electrode disappears first and the polysilicon film is exposed.

In addition, although a silicon substrate is used as the base of the gate electrode in this embodiment, even in a case where a silicon oxide film is used as the base of the gate electrode, the silicon oxide film is not etched similar to this embodiment since a deposited film containing Si—O bonding is deposited on the surface of the silicon oxide film that is exposed after the silicon nitride film is etched. Therefore, similar to the case of the silicon substrate, the spacers of the silicon nitride film can be formed without damaging the silicon oxide film serving as the base and the polysilicon film.

In this embodiment, the mixed gas containing the $CH_3F$ gas, the $O_2$ gas, and the $SiF_4$ gas is used as a process gas. However, an effect same as the effect in this embodiment can be obtained even if a fluorocarbon gas and an oxygen containing gas are respectively used as the $CH_3F$ gas and the $O_2$ gas. As the fluorocarbon gas, at least one gas among the $CH_3F$ gas, a $CH_2F_2$ gas, and a $CHF_3$ gas can be used.

As the oxygen containing gas, at least one gas among the $O_2$ gas, a CO gas, and a $CO_2$ gas can be used. Further, an inert gas may be added to a mixed gas containing the fluorocarbon gas, the oxygen containing gas, and the $SiF_4$ gas. As the inert gas, at least one gas among an He gas, an Ne gas, an Ar gas, an Xe gas, and a Kr gas can be used.

An effect same as the effect in this embodiment can be obtained even if a mixed gas containing a $CH_4$ gas and a fluorine containing gas is used as an alternative gas for the fluorocarbon gas. As the fluorine containing gas, at least one gas of a $SF_6$ gas and the $CF_4$ gas can be used.

In this embodiment, the film to be etched is the silicon nitride film. However, an effect same as the effect in this embodiment can be obtained even if a silicon nitride oxide film (SiON film) or a silicon nitride carbide oxide film (SiOCN film) is used as the film to be etched.

An effect same as the effect in this embodiment can be obtained even if a silicon carbide film (SiC film) or a silicon carbide oxide film (SiOC film) is used as the film to be etched. In the case of the silicon carbide film (SiC film) and the silicon carbide oxide film (SiOC film), O generated by dissociation of the $O_2$ gas during etching and C in the film to be etched combine with each other and $CO_x$ having high volatility is generated. Therefore, it is possible to improve a selected etching ratio of the film to be etched to the silicon substrate or the polysilicon film.

In this embodiment, the application example in the microwave plasma etching apparatus of the ECR (Electron Cyclotron Resonance) system employing the microwave is explained. However, the present invention is not limited to this. The present invention may be applied to a plasma etching apparatus including plasma generating means of a capacitive coupling type or an inductive coupling type.

Embodiment 3

In this embodiment, a method for forming a metal gate electrode that involves etching of a polysilicon film with a metal material as a base film is explained hereinafter as a plasma etching method for selectively plasma etching a film to be etched in comparison with a film different from the film to be etched using a gas that can cause to generate a deposited film of the same components as those of the film different from the film to be etched.

Figure 10A:
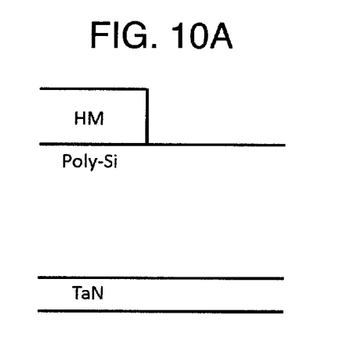
FIGS. 10A to 10D are diagrams showing etching progress in Embodiment 3.

As shown in FIG. 10A, a polysilicon film (Poly-Si) is etched using a hard mask (HM) as a mask and a tantalum nitride film (TaN) as a metal material of a base film. Even though a halogen-based gas such as HBr or $Cl_2$ is used as a process gas for etching the polysilicon film, the halogen-based gas also etches tantalum nitride.

Figure 10B:
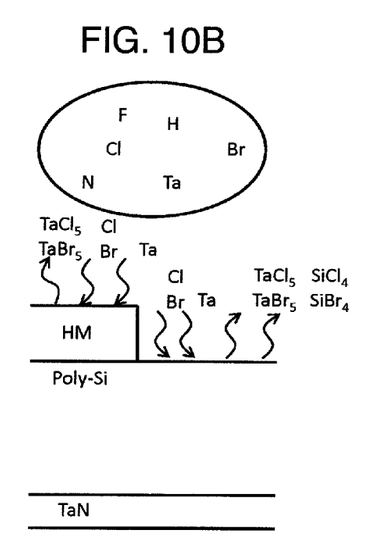

Here, a $TaF_5$ gas and an $N_2$ gas that generate a deposited film containing the same components as the tantalum nitride film serving as the base film are added to the halogen-based gas. When etching is performed using these gases, although tantalum is supplied from the plasma to the surface of the polysilicon film as shown in FIG. 10B, it is removed together with the polysilicon film by the halogen such as Cl or Br. When the polysilicon film is removed by etching, the tantalum nitride serving as the base film is exposed.

Figure 10C:
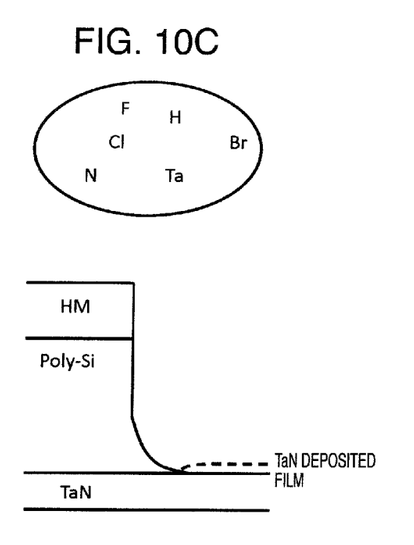
Figure 10D:
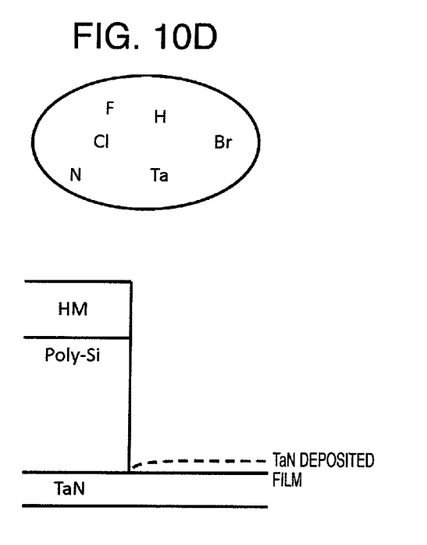

However, since a deposit containing tantalum nitride tends to be adsorbed on the surface of the tantalum nitride than on the surface of the polysilicon film, a deposited film containing tantalum nitride is formed as shown in FIG. 10C, and etching of the tantalum nitride does not progress. Moreover, while additional etching for making the shape of the polysilicon film vertical is needed, because etching of the tantalum nitride does not progress, a vertical shape as shown in FIG. 10D can be obtained without damaging the tantalum nitride.

Although tantalum nitride is used as a metal material in this embodiment, a similar effect can be obtained by adding $WF_6$ and $N_2$ to the process gas even when tungsten nitride is used.

In this embodiment, the application example in the microwave plasma etching apparatus of the ECR (Electron Cyclotron Resonance) system employing the microwave is explained. However, the present invention is not limited to this. The present invention may be applied to a plasma etching apparatus including plasma generating means of a capacitive coupling type or an inductive coupling type.

As explained above, the present invention provides a plasma etching method for selectively etching with plasma a film to be etched against a film different from the film to be etched using gas that can cause to generate a deposited film containing components same as components of the film different from the film to be etched. Therefore, according to the present invention, it is possible to substantially improve a selected etching ratio of the film to be etched in comparison with the film different from the film to be etched compared to the related art.

Further, the present invention provides a plasma etching method for selectively etching with plasma a film to be etched against a film different from the film to be etched using gas that can cause to generate a deposited film containing Si—O bonding. Therefore, according to the present invention, it is possible to substantially improve a selected etching ratio of the film to be etched in comparison with the film different from the film to be etched compared to the related art.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma etching method for selectively etching a silicon nitride film against a polysilicon film, wherein plasma etching of the silicon nitride film is performed using a mixed gas comprising a fluorocarbon gas, an oxygen containing gas, and a $SiF_4$ gas.

2. The plasma etching method according to claim 1, wherein the fluorocarbon gas is a $CH_3F$ gas, and the oxygen containing gas is an $O_2$ gas.

3. The plasma etching method according to claim 1, wherein the mixed gas further comprises an inert gas.

4. The plasma etching method according to claim 1, wherein, during said plasma etching of the silicon nitride film, a deposited film containing Si—O bonding is generated.

5. A plasma etching method for selectively etching a silicon nitride film against a polysilicon film, wherein plasma etching of the silicon nitride film is performed using a mixed gas comprising a $CH_4$ gas, a fluorine containing gas, an oxygen containing gas, and a $SiF_4$ gas.

6. The plasma etching method according to claim 5, wherein, during said plasma etching of the silicon nitride film, a deposited film containing Si—O bonding is generated.

* * * * *